(12) United States Patent
Zhang

(10) Patent No.: US 10,692,897 B2
(45) Date of Patent: Jun. 23, 2020

(54) FLEXIBLE DISPLAY HAVING SPACER DISPOSED BETWEEN TWO ADJACENT THIN FILM TRANSISTORS AND HAVING WIRE DISPOSED IN SPACER FOR ELECTRICAL CONNECTION BETWEEN THE TRANSISTORS

(71) Applicant: WUHAN CHINA STAR OPTOELECTRONICS SEMICONDUCTOR DISPLAY TECHNOLOGY CO., LTD., Wuhan, Hubei (CN)

(72) Inventor: Fuyang Zhang, Hubei (CN)

(73) Assignee: WUHAN CHINA STAR OPTOELECTRONICS SEMICONDUCTOR DISPLAY TECHNOLOGY CO., LTD., Wuhan, Hubei (CN)

(*) Notice: Subject to any disclaimer, the term of this patent is extended or adjusted under 35 U.S.C. 154(b) by 0 days.

(21) Appl. No.: 16/336,108

(22) PCT Filed: Oct. 12, 2018

(86) PCT No.: PCT/CN2018/110137
§ 371 (c)(1),
(2) Date: Mar. 24, 2019

(87) PCT Pub. No.: WO2020/015211
PCT Pub. Date: Jan. 23, 2020

(65) Prior Publication Data
US 2020/0144295 A1 May 7, 2020

(51) Int. Cl.
*H01L 27/12* (2006.01)
*G02F 1/1333* (2006.01)
(Continued)

(52) U.S. Cl.
CPC ...... *H01L 27/124* (2013.01); *G02F 1/133305* (2013.01); *H01L 23/528* (2013.01);
(Continued)

(58) Field of Classification Search
CPC ............... H01L 23/528; H01L 23/5286; H01L 23/5329; H01L 27/1214; H01L 27/124; H01L 27/1244
See application file for complete search history.

(56) References Cited

U.S. PATENT DOCUMENTS 7,352,429 B2 * 4/2008 Tseng .................. G02F 1/13394
349/155
9,818,640 B1 * 11/2017 Stephens ........... H01L 21/76816
(Continued)

FOREIGN PATENT DOCUMENTS

CN 104950535 A 9/2015
CN 106783917 A 5/2017
(Continued)

*Primary Examiner* — Stephen W Smoot
(74) *Attorney, Agent, or Firm* — Mark M. Friedman

(57) ABSTRACT

A flexible display is provided, including a substrate; a plurality of thin film transistors spacedly arranged apart from each other and disposed along a first direction on the substrate; a plurality of spacers spacedly arranged apart from each other and disposed along the first direction on the substrate, where each of the spacers fills an interval between two adjacent thin film transistors; and at least one wire configured to electrically connect the two adjacent thin film transistors, where the at least one wire is disposed in a corresponding spacer. The present disclosure can effectively prevent wire breakage between thin film transistors by using curved wires to electrically connect adjacent thin film transistors along the first direction in the substrate.

20 Claims, 3 Drawing Sheets

(51) Int. Cl.
*H01L 23/528* (2006.01)
*H01L 23/532* (2006.01)

(52) U.S. Cl.
CPC ...... *H01L 23/5329* (2013.01); *H01L 27/1214* (2013.01); *H01L 27/1218* (2013.01); *H01L 27/1244* (2013.01)

(56) References Cited

U.S. PATENT DOCUMENTS

| | | | |
|---|---|---|---|
| 9,887,127 B1 * | 2/2018 | Licausi | H01L 21/76816 |
| 10,192,780 B1 * | 1/2019 | Wang | H01L 21/76816 |
| 10,269,830 B1 | 4/2019 | Hu | |
| 2012/0032336 A1 * | 2/2012 | Lin | H01L 21/0276 |
| | | | 257/773 |
| 2019/0156708 A1 | 5/2019 | Li et al. | |
| 2019/0207131 A1 | 7/2019 | Lu | |

FOREIGN PATENT DOCUMENTS

| | | |
|---|---|---|
| CN | 207116427 U | 3/2018 |
| CN | 107946247 A | 4/2018 |
| CN | 108183126 A | 6/2018 |

\* cited by examiner

FLEXIBLE DISPLAY HAVING SPACER DISPOSED BETWEEN TWO ADJACENT THIN FILM TRANSISTORS AND HAVING WIRE DISPOSED IN SPACER FOR ELECTRICAL CONNECTION BETWEEN THE TRANSISTORS

FIELD OF DISCLOSURE

The present disclosure relates to displays, and more particularly to a flexible display having stretchable and compressible properties.

BACKGROUND

With development of display technology, flat display devices such as liquid crystal displays (LCDs) are widely used in mobile phones, televisions, personal digital assistants, digital cameras, laptops, computers and other consumer electronics products because of their high image quality, power savings, thinness, and wide application range.

In recent years, flexible display devices have become more and more popular because of their advantages of being thin, portable, and bendable. Existing flexible display panels are limited by structure, materials, equipment, etc., and the main development focuses on the bendability and foldability of the display panel. In order to increase operability and more vividness of display equipment to increase the user's experience, the display needs not only the bending characteristics, but also the stretchable and compressible characteristics.

In existing flexible displays with stretchable and compressible properties, various display elements on the display substrate are covered by a flexible material to protect those elements from damage. However, although the flexible material can protect the original display element, it is impossible to ensure that the wires connecting the display elements (such as thin film transistors) are not broken by stretching, compression, and bending of the flexible display device when the panel is bent or stretched.

Accordingly, it is necessary to provide a flexible display to solve the technical problems in the prior art.

SUMMARY OF THE DISCLOSURE

In order to solve technical problems mentioned above, an object of the present disclosure is to provide a flexible display having stretchable and compressible properties, where by changing the structure of the traditional flexible substrate, a wider deformation of flexible display is achieved.

In order to achieve the object described above, the present disclosure provides a flexible display, including: a substrate; a plurality of thin film transistors spacedly arranged apart from each other and disposed along a first direction on the substrate; a plurality of spacers spacedly arranged apart from each other and disposed along the first direction on the substrate, where each of the spacers fills an interval between two adjacent thin film transistors, and top surfaces of the spacers are at a same level as top surfaces of the plurality of thin film transistors, and a material of the spacer includes polyimide; and at least one wire configured to electrically connect the two adjacent thin film transistors, where the at least one wire is disposed in a corresponding spacer, and the at least one wire is curved, and a length of the at least one wire is greater than a distance between the two adjacent thin film transistors.

In one preferred embodiment of the present disclosure, the distance between the two adjacent thin film transistors is between 100 nanometers and 1000 nanometers.

In one preferred embodiment of the present disclosure, the length of the at least one wire is between 150 nanometers and 1500 nanometers.

In one preferred embodiment of the present disclosure, the at least one wire includes a first wire configured to electrically connect first metal layers of the two adjacent thin film transistors.

In one preferred embodiment of the present disclosure, each of the first metal layers includes a gate of a corresponding thin film transistor.

In one preferred embodiment of the present disclosure, the at least one wire includes a second wire configured to electrically connect second metal layers of the two adjacent thin film transistors.

In one preferred embodiment of the present disclosure, each of the second metal layers includes a source and a drain of a corresponding thin film transistor.

In one preferred embodiment of the present disclosure, each of the thin film transistors includes: a P-type low temperature polysilicon layer disposed on the substrate; a gate insulating layer disposed on the P-type low temperature polysilicon layer; a first metal layer disposed on the gate insulating layer; an interlayer insulating layer disposed on the first metal layer; and a second metal layer disposed on the interlayer insulating layer, where the second metal layer is in contact with the P-type low temperature polysilicon layer through a via hole penetrating the gate insulating layer and the interlayer insulating layer.

The present disclosure also provides a flexible display, including: a substrate; a plurality of thin film transistors spacedly arranged apart from each other and disposed along a first direction on the substrate; a plurality of spacers spacedly arranged apart from each other and disposed along the first direction on the substrate, where each of the spacers disposed between two adjacent thin film transistors; and at least one wire configured to electrically connect the two adjacent thin film transistors, where the at least one wire is disposed in a corresponding spacer.

In one preferred embodiment of the present disclosure, top surfaces of the spacers are at a same level as top surfaces of the plurality of thin film transistors.

In one preferred embodiment of the present disclosure, a length of the at least one wire is greater than a distance between the two adjacent thin film transistors.

In one preferred embodiment of the present disclosure, the distance between the two adjacent thin film transistors is between 100 nanometers and 1000 nanometers.

In one preferred embodiment of the present disclosure, the length of the at least one wire is between 150 nanometers and 1500 nanometers.

In one preferred embodiment of the present disclosure, a material of the spacer includes polyimide.

In one preferred embodiment of the present disclosure, the at least one wire includes a first wire configured to electrically connect first metal layers of the two adjacent thin film transistors.

In one preferred embodiment of the present disclosure, each of the first metal layers includes a gate of a corresponding thin film transistor.

In one preferred embodiment of the present disclosure, the at least one wire includes a second wire configured to electrically connect second metal layers of the two adjacent thin film transistors.

In one preferred embodiment of the present disclosure, each of the second metal layers includes a source and a drain of a corresponding thin film transistor.

In one preferred embodiment of the present disclosure, each of the thin film transistors includes: a P-type low temperature polysilicon layer disposed on the substrate; a gate insulating layer disposed on the P-type low temperature polysilicon layer; a first metal layer disposed on the gate insulating layer; an interlayer insulating layer disposed on the first metal layer; and a second metal layer disposed on the interlayer insulating layer, where the second metal layer is in contact with the P-type low temperature polysilicon layer through a via hole penetrating the gate insulating layer and the interlayer insulating layer.

In one preferred embodiment of the present disclosure, the at least one wire is curved.

In comparison to prior art, in the present disclosure, a spacer is filled between the thin film transistors, so that when the flexible display is bent, the stress is concentrated on the spacer, thereby preventing a risk that the thin film transistor is changed or broken due to the bending. Furthermore, the present disclosure is electrically connected by using curved wires between adjacent thin film transistors along an X direction of a substrate, and the wires are disposed in the spacer without being positioned above the thin film transistor, thereby effectively preventing the wires breakage between the thin film transistors.

DETAILED DESCRIPTION

The structure and the technical means adopted by the present disclosure to achieve the above and other objects can be best understood by referring to the following detailed description of the preferred embodiments and the accompanying drawings.

Figure 1:
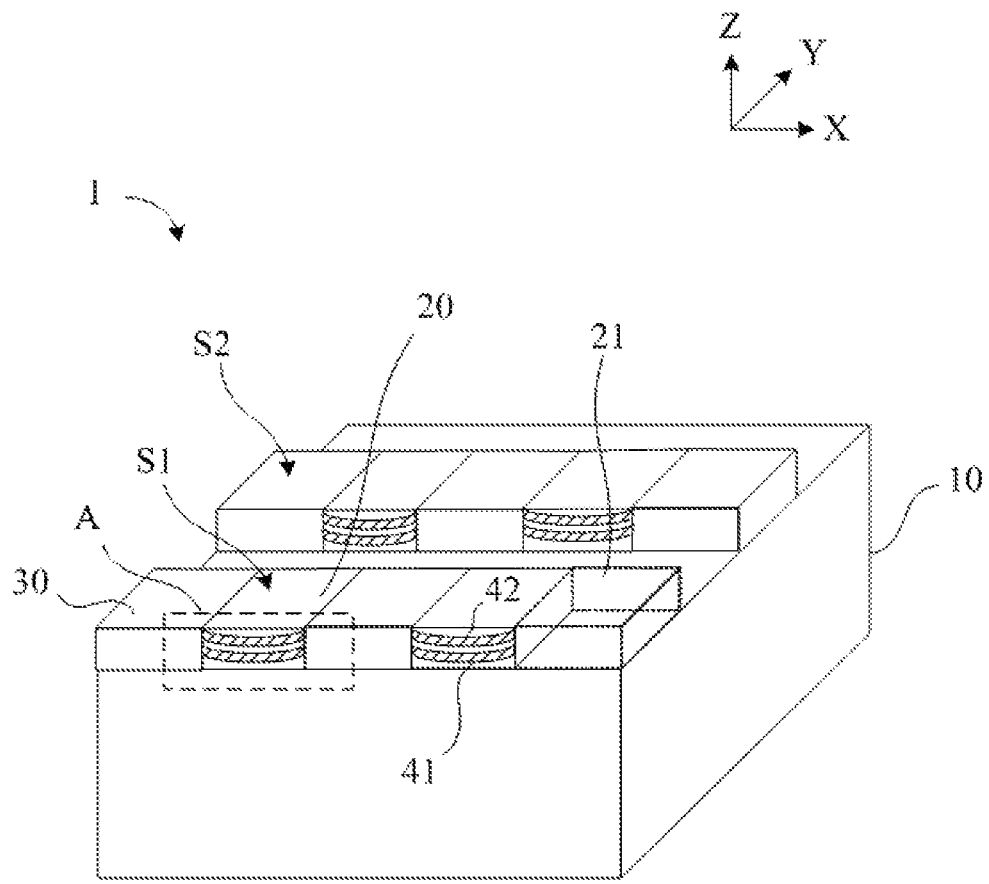
FIG. 1 shows a schematic cross-sectional view of a flexible display of a preferred embodiment of the present disclosure.

Referring to FIG. 1, which shows a schematic cross-sectional view of a flexible display 1 of a preferred embodiment of the present disclosure. The flexible display 1 is a new type of flexible thin film transistor display panel based on the existing flexible display technology. The flexible display panel based on this technology can not only achieve bending, folding, but also the ability of stretchable and compressible. The flexible display 1 includes a substrate 10, spacers 20, a plurality of thin film transistors 30, and wire 41 and wire 42. The substrate 10 is selected from a flexible substrate that can be bent and stretched. The plurality of thin film transistors 30 are disposed on the substrate 10 and arranged alternatively along a first direction (i.e., an X direction) of the substrate 10. The plurality of spacers 20 are also disposed on the substrate 10, and are arranged alternatively along the X direction of the substation 10. Each spacer 20 is disposed between two adjacent thin film transistors 30. Optionally, the plurality of thin film transistors 30 arranged in an array are formed on the substrate 10 at the time of fabrication, and the adjacent two thin film transistors 30 are spaced apart from each other. Then, an organic material is filled in an interval of the adjacent two thin film transistors 30 to form the spacer 20, where the organic material preferably includes a polyimide.

As shown in FIG. 1, a top surface S1 of the spacer 20 is on the same level as top surfaces S2 of the plurality of thin film transistors 30. That is, the material of the spacer 20 is only filled in the interval between the adjacent two thin film transistors 30, and does not cover over the thin film transistor 30. In addition, the wires 41 and 42 are disposed in the spacer 20 for electrically connecting two adjacent thin film transistors 30, wherein the specific design of the wires 41 and 42 will be described later.

Figure 2:
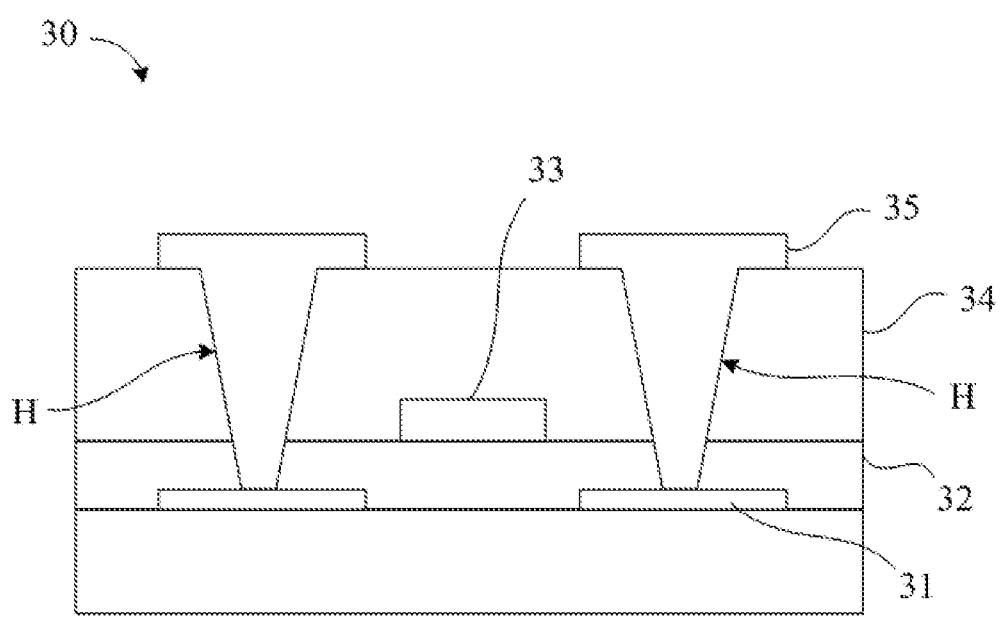
FIG. 2 is a schematic structural diagram showing a thin film transistor of the flexible display of FIG. 1.

Referring to FIG. 2, which shows a schematic structural diagram showing a thin film transistor 30 of the flexible display 1 of FIG. 1. The thin film transistor 30 includes a P-type low temperature polysilicon layer 31, a gate insulating layer 32, a first metal layer 33, an interlayer insulating layer 34, and a second metal layer 35. The P-type low temperature polysilicon layer 31 is formed on the substrate 10. Optionally, at the time of fabrication, a polysilicon layer is completely covered on the substrate 10. Then, the polysilicon layer is patterned to form a plurality of sub-blocks which are spaced from each other, and then a P-type doping is performed on the sub-blocks, thereby obtaining a source contact region and a drain contact region of the P-type low temperature polysilicon layer 31 are obtained.

As shown in FIG. 2, the gate insulating layer 32 is disposed on the P-type low temperature polysilicon layer 31 and covers the substrate 10 and the P-type low temperature polysilicon layer 31. The first metal layer 33 is disposed on the gate insulating layer 32, and the first metal layer 33 is obtained through a patterning process which serves as a gate of the thin film transistor 30. The interlayer insulating layer 34 is disposed on the first metal layer 33. In particular, the interlayer insulating layer 34 will cover the gate insulating layer 32 and the first metal layer 33. After forming the interlayer insulating layer 34, the gate insulating layer 32 and the interlayer insulating layer 34 are patterned to obtain via holes H penetrating the gate insulating layer 32 and the interlayer insulating layer 34. The via holes H may expose the position of the P-type low temperature polysilicon layer 31 corresponding to the source contact region and the drain contact region. The second metal layer 35 is disposed on the interlayer insulating layer 34, and the second metal layer 35 is obtained through the pattern processing, which serves as the source and the drain of the thin film transistor 30, where the source and the drain are respectively in contact with the source contact region and the drain contact region via the respective via holes H.

Figure 3:
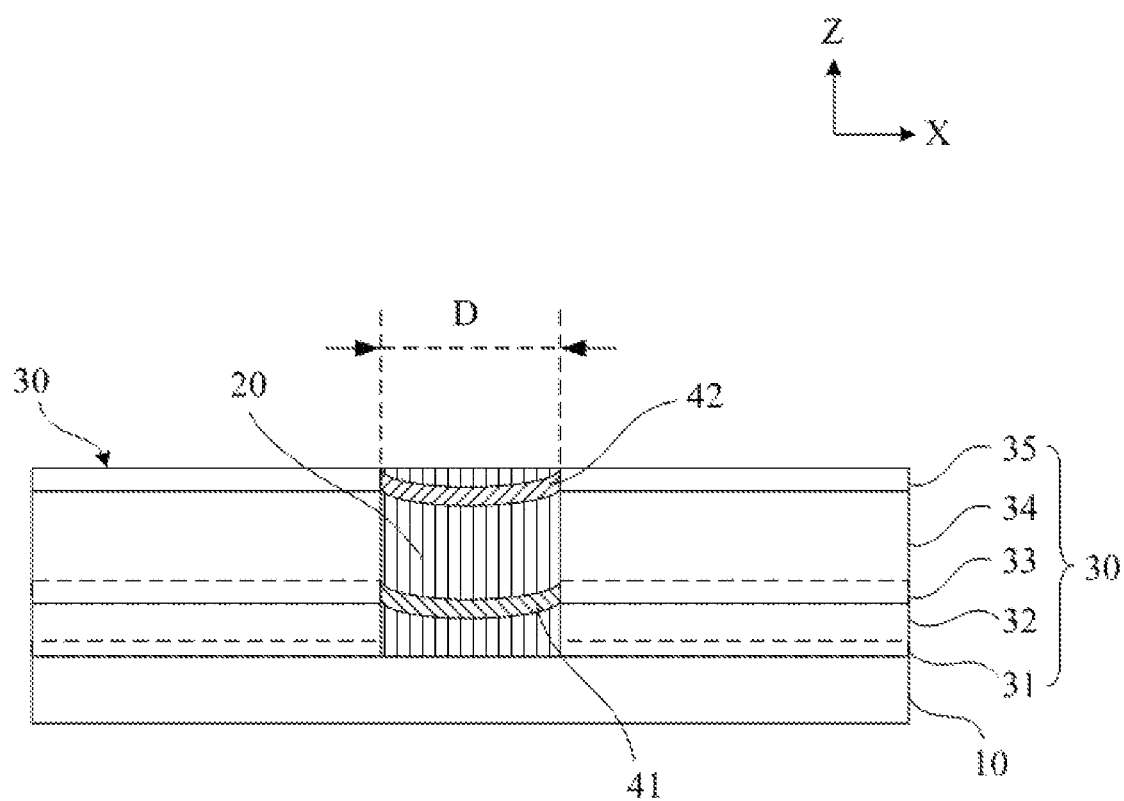
FIG. 3 is an enlarged schematic diagram showing a portion A of the flexible display of FIG. 1, showing connection relationship between wires and thin film transistors.

Referring to FIG. 3, which is an enlarged schematic diagram showing a portion A of the flexible display 1 of FIG. 1, showing connection relationship between wires 41 and 42 and thin film transistors 30. The wires located in the spacer 20 includes a first wire 41 and a second wire 42. The first wire 41 is used to electrically connect the first metal layers 33 of the two adjacent thin film transistors 30, that is, being used to electrically connect the gates of the two adjacent thin film transistors 30. Moreover, the second wire 42 is used to electrically connect the second metal layers 35 of the two adjacent thin film transistors 30, that is, being used to electrically connect the source and the drain of the two adjacent thin film transistors 30. It should be noted that a length of the first wire 41 and the second wire 42 is greater than a distance D between two adjacent thin film transistors 30. Specifically, the first wire 41 and the second wire 42 are curved in an arc shape, and curvature, width, and length of the first wire 41 and the second wire 42 vary with the distance D of the two adjacent thin film transistors 30 in the X direction, and also vary depending on the material of the substrate 10 or spacer 20.

Optionally, the distance D between two adjacent thin film transistors 30 is between 100 nanometers and 1000 nanometers, and the lengths of the first wire 41 and the second wire 42 are between 150 nanometers and 1500 nanometers. Since the substrate 10 or spacer 20 is stretchable and compressible, and the thin film transistor 30 has limited deformability, the formed flexible display 1 not only has stretchable and compressible deformation characteristics, but also ensures stability of the structure of the thin film transistor 30.

In summary, in the present disclosure, a spacer 20 is filled between the thin film transistors 30, so that when the flexible display 1 is bent, the stress is concentrated on the spacer 20, thereby preventing a risk that the thin film transistor 30 is changed or broken due to the bending. Furthermore, the present disclosure is electrically connected by using curved wires between adjacent thin film transistors along an X direction of a substrate 10, and the wires 41 and 42 are disposed in the spacer 20 without being positioned above the thin film transistor 30, thereby effectively preventing the wires 41 and 42 breakage between the thin film transistors.

The above descriptions are merely preferable embodiments of the present disclosure. Any modification or replacement made by those skilled in the art without departing from the principle of the present disclosure should fall within the protection scope of the present disclosure.

What is claimed is:

1. A flexible display, comprising:
    a substrate;
    a plurality of thin film transistors spacedly arranged apart from each other and disposed along a first direction on the substrate;
    a plurality of spacers spacedly arranged apart from each other and disposed along the first direction on the substrate, wherein each of the spacers fills an interval between two adjacent thin film transistors, and top surfaces of the spacers are at a same level as top surfaces of the plurality of thin film transistors, and a material of the spacer comprises polyimide; and
    at least one wire configured to electrically connect the two adjacent thin film transistors, wherein the at least one wire is disposed in a corresponding spacer, and the at least one wire is curved, and a length of the at least one wire is greater than a distance between the two adjacent thin film transistors.

2. The flexible display as claimed in claim 1, wherein the distance between the two adjacent thin film transistors is between 100 nanometers and 1000 nanometers.

3. The flexible display as claimed in claim 1, wherein the length of the at least one wire is between 150 nanometers and 1500 nanometers.

4. The flexible display as claimed in claim 1, wherein the at least one wire comprises a first wire configured to electrically connect first metal layers of the two adjacent thin film transistors.

5. The flexible display as claimed in claim 4, wherein each of the first metal layers comprises a gate of a corresponding thin film transistor.

6. The flexible display as claimed in claim 1, wherein the at least one wire comprises a second wire configured to electrically connect second metal layers of the two adjacent thin film transistors.

7. The flexible display as claimed in claim 6, wherein each of the second metal layers comprises a source and a drain of a corresponding thin film transistor.

8. The flexible display as claimed in claim 1, wherein each of the thin film transistors comprises:
    a P-type low temperature polysilicon layer disposed on the substrate;
    a gate insulating layer disposed on the P-type low temperature polysilicon layer;
    a first metal layer disposed on the gate insulating layer;
    an interlayer insulating layer disposed on the first metal layer; and
    a second metal layer disposed on the interlayer insulating layer, wherein the second metal layer is in contact with the P-type low temperature polysilicon layer through a via hole penetrating the gate insulating layer and the interlayer insulating layer.

9. A flexible display, comprising:
    a substrate;
    a plurality of thin film transistors spacedly arranged apart from each other and disposed along a first direction on the substrate;
    a plurality of spacers spacedly arranged apart from each other and disposed along the first direction on the substrate, wherein each of the spacers is disposed between two adjacent thin film transistors; and
    at least one wire configured to electrically connect the two adjacent thin film transistors, wherein the at least one wire is disposed in a corresponding spacer.

10. The flexible display as claimed in claim 9, wherein top surfaces of the spacers are at a same level as top surfaces of the plurality of thin film transistors.

11. The flexible display as claimed in claim 9, wherein a length of the at least one wire is greater than a distance between the two adjacent thin film transistors.

12. The flexible display as claimed in claim 11, wherein the distance between the two adjacent thin film transistors is between 100 nanometers and 1000 nanometers.

13. The flexible display as claimed in claim 11, wherein the length of the at least one wire is between 150 nanometers and 1500 nanometers.

14. The flexible display as claimed in claim 9, wherein a material of the spacer comprises polyimide.

15. The flexible display as claimed in claim 9, wherein the at least one wire comprises a first wire configured to electrically connect first metal layers of the two adjacent thin film transistors.

16. The flexible display as claimed in claim 15, wherein each of the first metal layers comprises a gate of a corresponding thin film transistor.

17. The flexible display as claimed in claim 9, wherein the at least one wire comprises a second wire configured to electrically connect second metal layers of the two adjacent thin film transistors.

18. The flexible display as claimed in claim 17, wherein each of the second metal layers comprises a source and a drain of a corresponding thin film transistor.

19. The flexible display as claimed in claim 9, wherein each of the thin film transistors comprises:
    a P-type low temperature polysilicon layer disposed on the substrate;
    a gate insulating layer disposed on the P-type low temperature polysilicon layer;
    a first metal layer disposed on the gate insulating layer;
    an interlayer insulating layer disposed on the first metal layer; and a second metal layer disposed on the interlayer insulating layer, wherein the second metal layer is in contact with the P-type low temperature polysilicon layer through a via hole penetrating the gate insulating layer and the interlayer insulating layer.

20. The flexible display as claimed in claim 9, wherein the at least one wire is curved.

\* \* \* \* \*

UNITED STATES PATENT AND TRADEMARK OFFICE
CERTIFICATE OF CORRECTION

PATENT NO. : 10,692,897 B2
APPLICATION NO. : 16/336108
DATED : June 23, 2020
INVENTOR(S) : Fuyang Zhang Page 1 of 1

It is certified that error appears in the above-identified patent and that said Letters Patent is hereby corrected as shown below:

On the Title Page

Insert:
--(30) Foreign Application Priority Data
July 17, 2018 (CN) 201810782121.4--

Signed and Sealed this
Twenty-fifth Day of August, 2020

Andrei Iancu
*Director of the United States Patent and Trademark Office*